United States Patent [19]

Jimarez et al.

[11] Patent Number: 5,509,557
[45] Date of Patent: Apr. 23, 1996

[54] DEPOSITING A CONDUCTIVE METAL ONTO A SUBSTRATE

[75] Inventors: Lisa J. Jimarez, Newark Valley; William H. Lawrence, Greene; Voya R. Markovich, Endwell; Robert J. Owen, Binghamton; Carlos J. Sambucetti, Croton-on-Hudson, all of N.Y.

[73] Assignee: International Business Machines Corporation, Armonk, N.Y.

[21] Appl. No.: 184,930

[22] Filed: Jan. 24, 1994

[51] Int. Cl.$^6$ ............................. B05D 3/04; C23F 1/00
[52] U.S. Cl. .................. 216/95; 216/35; 216/36; 216/106; 427/304; 427/305; 427/306; 427/307; 427/282; 427/383.1; 427/385.5; 427/322
[58] Field of Search ....................... 427/304–306, 427/307, 282, 383.1, 385.5, 322; 156/656.1; 216/95, 35, 36, 100

[56] References Cited

U.S. PATENT DOCUMENTS

| | | | |
|---|---|---|---|
| 3,011,920 | 12/1961 | Shipley, Jr. | 427/304 |
| 3,099,608 | 7/1963 | Radovsky et al. | 204/15 |
| 3,632,388 | 1/1972 | Grunwald | 117/47 A |
| 3,808,028 | 4/1974 | Lando | 427/306 |
| 3,962,495 | 6/1976 | Feidstein | 427/306 |
| 3,983,267 | 9/1976 | Norris | 427/306 |
| 4,066,809 | 1/1978 | Alpaugh et al. | 427/444 |
| 4,358,479 | 11/1982 | Canestaro et al. | 427/98 |
| 4,448,804 | 5/1984 | Amelio et al. | 427/98 |
| 4,532,015 | 7/1985 | Boultinghouse et al. | 427/306 |
| 4,718,972 | 1/1988 | Babu et al. | 156/628 |
| 4,861,648 | 8/1989 | Kleinschmidt et al. | 428/40 |
| 5,137,618 | 8/1992 | Burnett et al. | 205/125 |
| 5,215,645 | 6/1993 | DiFranco et al. | 205/77 |
| 5,215,646 | 6/1993 | Wolski et al. | 205/77 |
| 5,246,564 | 9/1993 | Tamiya et al. | 427/306 |

OTHER PUBLICATIONS

Jimarez, et al., Factors Affecting the Adhesion of Fluoropolymer Composites to Commercial Copper Foils, Transactions of the ASME, Journal of Electronic Packaging, vol. 115, Sep., 1993, pp. 256–263.

Bhatt et al., Full–Additive Process for the Manufacture of Copper Bondable Surface Products, Reasearch Disclosure, Apr. 1991, No. 324, Kenneth Mason Publications Ltd., England.

*Primary Examiner*—Janyce Bell
*Attorney, Agent, or Firm*—Pollock, Vande Sande & Priddy

[57] ABSTRACT

A method for depositing a conductive metal onto a dielectric substrate is provided. The method includes obtaining a metal sheet having a roughened surface that has the following parameters:

$R_a$=0.05–0.08 mil, $R_{max}$=0.20–0.55 mil, $S_m$=1.00–3.00 mil, $R_p$=0.20–0.35 mil, and surface area=0.90–1.20 square mils wherein $R_a$ is the average roughness and the arithmetic mean of the departures from horizontal mean line profile;

$R_{max}$ is the maximum peak-to-valley height;

$S_m$ is the mean spacing between high spots at the mean line;

$R_p$ is the maximum profile height from the mean line; and surface area is the area under the surface profile from each measurement using a Talysurf S-120 profilometer;

The sheet is laminated to the dielectric substrate surface by pressing the roughened surface of the metal sheet against the surface of the substrate and then removed from the substrate. The substrate surface is seeded to render it active for electroless plating thereon; and then a metal from an electroless plating bath is plated thereon.

In another method, the dielectric substrate is seeded to render it active for electroless plating thereon. A metal is then plated thereon from an electroless plating bath. The plated metal is subjected to temperature of at least about 100° C. for a time sufficient to increase the adhesion of the metal to the substrate.

22 Claims, 1 Drawing Sheet

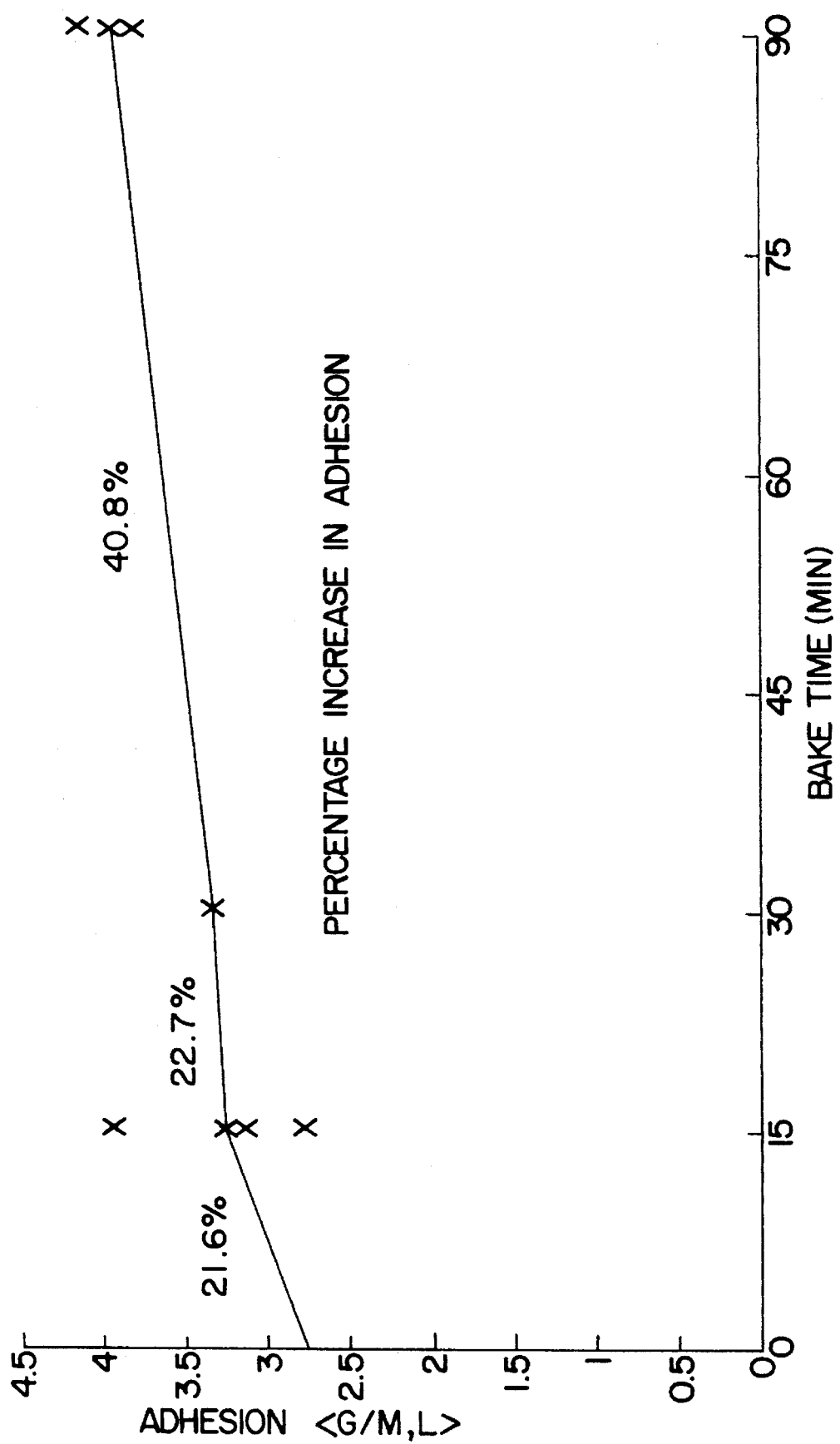
FIG. I

DEPOSITING A CONDUCTIVE METAL ONTO A SUBSTRATE

DESCRIPTION

1. Technical Field

The present invention is concerned with conditioning at least one major surface of a dielectric substrate to prepare the substrate for the electroless deposition of a conductive metal thereon, followed by the plating thereon. The present invention finds particular applicability for the manufacture of printed circuit cards and boards.

2. Background Art

In the manufacture of printed circuit cards and boards, a dielectric sheet material is employed as the substrate. A conductive circuit pattern is provided on one or both of the major surfaces of the substrate.

A conductive pattern can be formed on the surface of the substrate using a variety of known techniques. These known techniques include the subtractive technique, where a layer of copper is etched to form the desired circuit pattern, the EDB (electroless direct bond) technique, where copper is electrolessly plated directly on the surface of the substrate in the desired pattern, and the peel-apart technique, where the desired circuit pattern is plated up from a thin layer of peel-apart copper.

If it is desired to use the EDB technique, it is necessary to plate directly on the surface of the substrate.

Since the dielectric substrate is nonconductive, in order to plate on the substrate, the substrate must be seeded or catalyzed prior to the deposition of metal onto the substrate. The seeder, in addition to coating the substrate, also coats the walls of the holes or vias of the board.

Among the more widely employed procedures for catalyzing a substrate is the use of a stannous chloride sensitizing solution and a palladium chloride activator, to form a layer of metallic palladium particles. For instance, one method for catalyzing a dielectric substrate is exemplified by U.S. Pat. No. 3,011,920, which includes sensitizing the substrate by first treating it with a solution of a colloidal metal, accelerating the treatment with a selective solvent to remove protective colloids for the sensitized dielectric substrate, and then electrolessly depositing a metal coating on the sensitized substrate; for example, with copper from a solution of a copper salt and a reducing agent. Also, as suggested, for example, in U.S. Pat. No. 3,009,608, a dielectric substrate can be pretreated by depositing a thin film of a "conductivator" type of metal particle, such as palladium metal, from a semicolloidal solution onto the dielectric substrate to provide a conducting base which permits electroplating with conductive metal on the conductivated base. Moreover, U.S. Pat. No. 3,632,388 suggests a method for treating a polymeric plastic substrate in a plating process, which utilizes a preliminary chromic acid etch, followed by a one step activation in a tin-palladium hydrosol.

The foregoing discussed methods have been satisfactory for electroless or electroplating thin layers of conductive materials on nonconductive dielectric substrates for many prior art applications. Of further interest is U.S. Pat. No. 4,066,809, which discloses the use of a so-called "triple seeding" technique. This technique preferred in U.S. Pat. No. 4,066,809, includes contacting the surfaces of the dielectric material with an aqueous stannous chloride sensitizing solution followed by contacting the surfaces of the dielectric material with an aqueous palladium chloride activator solution, and then followed by contacting the surfaces of the dielectric material, with an aqueous palladium chloride/stannous chloride/hydrochloric acid seeder bath.

Nevertheless, one of the major difficulties encountered early on in preparing additive printed circuit boards was obtaining sufficient adhesion between the chemically deposited copper or other conductive metal, and the dielectric substrate. One procedure suggested employs a sacrificial metal layer. Briefly, such process includes laminating a sheath or film of a metal, such as copper, nickel or aluminum, onto the surface of the dielectric substrate. The metal film is then stripped or etched completely from the substrate prior to application of any circuitry. This technique creates an irregular surface on the dielectric substrate, which in turn, provides for improved bonding sites for the subsequently plated additive metal. However, certain problems still exist in preparing printed circuit boards by this method. One such problem is the existence of voids in the plated metal coatings.

Improvement in the definition of patterns of the circuitry lines was then obtained by using particular modified copper foil disclosed in U.S. Pat. No. 4,358,479, disclosure of which is incorporated herein by reference.

Moreover, increased efficiency of the seeding or activation of a dielectric material has been achieved by contact of the substrate with an acidic solution containing a multifunctional cationic group containing at least two available ionic moieties as disclosed in Bupp, et al. U.S. Pat. No. 4,448,804, disclosure of which is incorporated herein by reference.

Notwithstanding the significant improvements achieved by the above techniques, there still remains room for improvement in the adhesion of the metal circuitry to the dielectric substrate.

Furthermore, the use of replicate surface technology is presently limited in extension to fine line geometrics by the surface roughness required to meet circuit pattern adhesion specification. Typically, replicate surface copper has surface roughness values an order of magnitude greater. As line widths decrease, the copper line adhesion also decreases, since the line is smaller than the peak-to-peak height (SM). Yields at the photoresist operation also decline, due to the mobility of the photoresist to conform to the rough surface and resolve fine features concurrently.

A functional problem also exists with the present replicate surface copper. For high frequency applications, the signal propogation is affected in an adverse manner. Surface roughness of present replicate surface copper has proven to be unsatisfactory for high speed ditigal and microwave applications. The present invention minimizes signal propogation delay and impedance variability, and is suitable for high frequency applications.

SUMMARY OF INVENTION

The present invention provides for increased efficiency of the seeding or activation of a dielectric material for subsequent electroless plating. This, in turn, results in improved and more reliable electroless plating of conductive metals.

The present invention, according to another aspect, provides for improved adhesion of the conductive metal, by subsequent treatment after the deposition from the electroless plating bath.

According to one aspect of the present invention, a conductive metal is deposited onto the surface of a dielectric substrate, whereby a metal sheet having a roughened surface having the following parameters:

$R_a$=0.05–0.08 mil, $R_{max}$=0.20–0.55 mil, $S_m$=1.00–3.00 mil, $R_p$=0.20–0.35 mil, and surface area=0.90–1.20 square mils wherein $R_a$ is the average roughness and the arithmetic mean of the departures from horizontal mean line profile.

$R_{max}$ is the maximum peak-to-valley height;

$S_m$ is the mean spacing between high spots at the mean line;

$R_p$ is the maximum profile height from the mean line; and surface area is the area under the surface profile from each measurement using a Talysurf S-120 profilometer is obtained.

The metal sheet is laminated to the dielectric substrate surface by pressing the roughened surface of the metal sheet against the surface of the substrate.

The metal is removed from the substrate and the substrate is then seeded to render it active for electroless plating thereon. A conductor is then plated on the substrate from an electroless plating bath.

In another aspect of the present invention, a dielectric substrate is seeded to render it active for electroless plating thereon. A metal is then plated thereon from an electroless plating bath. The plated metal is then subjected to temperature of at least about 110° C. for a time sufficient to increase the adhesion of the metal to the substrate.

SUMMARY OF DRAWINGS

FIG. 1 is a graph showing adhesion test results.

BEST AND VARIOUS MODES FOR CARRYING OUT INVENTION

The process of the present invention is applicable to plating a wide variety of dielectric (non-conductor) substrates. Dielectric substrates described in the prior art, including thermoplastic and thermosetting resins, may be plated in accordance with the present invention.

Typical thermosetting polymeric materials include epoxy, phenolic based materials, and polyamides. The dielectric materials may be molded articles of the polymers containing fillers and/or reinforcing agents, such as glass-filled epoxy or phenolic based materials. Examples of some phenolic type materials include copolymers of phenol, resorcinol, and cresol. Examples of some suitable thermoplastic polymeric materials include polyolefins, such as polypropylene, polysulfones, polycarbonates, nitrile rubbers, ABS polymers, and fluorinated polymeric materials, such as polytetrafluoroethylene.

More typically, the dielectric substrates employed are FR-4 epoxy compositions.

A typical FR-4 epoxy composition contains 70–90 parts of brominated polyglycidyl ether of bisphenol-A and 10–30 parts of tetrakis (hydroxyphenyl) ethane tetraglycidyl ether cured with 3 to 4 parts of dicyandiamide, and 0.2 to 0.4 parts of a tertiary amine, all parts being parts by weight per 100 parts of resin solids.

Another typical FR-4 epoxy composition contains:

a) about 25 to about 30 parts by weight of a tetrabrominated diglycidyl ether of bisphenol-A, having an epoxy equivalent weight of about 350 to about 450;

b) about 10 to about 15 parts by weight of a tetrabrominated diglycidyl ether of bisphenol-A, having an epoxy equivalent weight of about 600 to about 750; and c) about 55 to about 65 parts by weight of at least one epoxidized non-linear novolak, having at least terminal epoxy groups, along with suitable curing and/or hardening agents.

Another typical FR-4 epoxy composition contains about 70 to about 90 parts of brominated polyglycidyl ether of bisphenol-A, and 10 to 30 parts of tetrakis (hydroxyphenyl) ethane tetraglycidyl ether cured with 0.8 to 1 part of 2-methyl imidazole.

Still another FR-4 epoxy composition employs tetrabromo bisphenol-A as the curing agent, along with 2-methyl imidazole as the catalyst.

A layer of a conductive metal having a roughened surface, such as a copper sheet, is laminated onto at least one of the major surfaces of the dielectric substrate. This is carried out by pressing the roughened surface of the copper sheet against the substrate surface.

It has been found pursuant to the present invention that for enhanced seed retention, adhesion of subsequently plated metal (e.g., copper) and adhesion of photoresist, the roughened surface must have the following morphology:

1) $R_a$=0.05–0.08 mil,

2) $R_{max}$=0.20–0.55 mil,

3) $S_m$=1.00–3.00 mil,

4) $R_p$=0.20–0.35 mil, and 5) surface area=0.90–1.20 square mils wherein $R_a$ is the average roughness and the arithmetic mean of the departures from horizontal mean line profile.

$R_{max}$ is the maximum peak-to-valley height;

$S_m$ is the mean spacing between high spots at the mean line;

$R_p$ is the maximum profile height from the mean line; and surface area is the area under the surface profile from each measurement using a Talysurf S-120 profilometer.

$S_m$ is assessed over one sampling length and $R_p$ is the maximum profile height from the mean line within the sampling length. The preferred metal foils are copper metal foils, and those having the required characteristics are available from Gould Electronics; Foil Div.-McConnelesville, Ohio, or Oak Mitsui.

The metal foils employed pursuant to the present invention have a high surface area surface-modified copper foil with low surface roughness. This type of foil has a lot of dendrites and such are low to the metal surface. This allows for a direct transfer onto the dielectric after lamination that goes back into the side walls of the peaks and valleys. The dielectric then has pockets with low surface energies where the resist, seed, and metal plating could readily adhere.

An undesirable morphology would be one with a low surface area and high surface roughness. This type of configuration could be characterized as very jagged. The side walls would be smoother on the peaks and valleys, which would result in the surface energy being high and chances of wetting these walls seed, photo resist, or copper plate would be significantly reduced.

Bonding of a dielectric material substrate to the metal foil is carried out by pressing together a sheet of the dielectric substrate material, and a sheet of the foil required by the present invention, with the roughened surface next to or confronting the dielectric material, in a preheated laminating press at a predetermined pressure and temperature as for example, about 260 to about 800 psi, and preferably about 500 psi and about 340° F. The time of the pressing operation is variable, depending upon the particular dielectric substrate material employed and the pressure employed. About 1 hour is adequate for the above conditions. The pressing can be done by loading a stack of panels on top of each other in the press. A practical amount is about 12 panels.

Next, the foil is removed from the entire dielectric substrate surface chemically by treating with an etchant, and preferably by immersion of the structure into the etching bath. In the case of copper foil, a copper etchant is employed. Copper etchant compositions are well known and include, for instance, solutions of cupric chloride, ferric chloride, sodium peroxydisulfate, ammoniacal chlorite, ammoniacal persulfate, and nitric acid. In general, all stripping solutions are operative in the practice of the present invention, so long as they do not cause excessive attack of the dielectric substrate material.

After this, it is generally suitable to subject the board to a water rinse and/or a mild alkali bath rinse to clean the board.

Thru-holes can be drilled prior to or after removal of the metal foil. Such are preferably drilled through the substrate by a laser beam. Also, if desired, blind holes or vias can be drilled in the substrate. Subsequently, the holes are cleaned or desmeared for removal of drill smear. Typical desmear processes include solvent treatment with a chrome sulfuric acid composition, A150-persulfate composition, or potassium hydroxide.

The substrate is then seeded or catalyzed to render it active for subsequent electroless plating. According to preferred aspects of the present invention, the substrate surface including the holes is treated with an acidic solution, containing a multifunctional ionic copolymer, containing at least two available cationic functional moieties. The preferred ionic moieties are quaternary phosphonium and quaternary ammonium groups. Copolymers containing at least two cationic moieties, such as, for example, copolymers of polyacrylamide forming the inert backbone and functionally active tetraalkylammonium compounds, are commercially available and need not be described herein in detail. Multifunctional cationic copolymers of that type are Reten 210, and Reten 220, available from HERCULES, description of which can be found in "Water-Soluble Polymers," Bulletin VC-482A, HERCULES, Inc., Wilmington, Del., 1989, disclosure of which is incorporated herein by reference.

Reten 210 is in powder form and is a copolymer of acrylamide and beta-methacryloxyethyltrimethylammonium methyl sulphate, of which a 1% solution has a Brookfield viscosity of 600–1000 cps. Reten 220 is also in powder form and consists of the same monomers as Reten 210, but its 1% solution has a Brookfield viscosity of 800–1200 cps. The molecular weights of the Reten polymers are usually relatively high and vary from about 50,000 to about 1,000,000 or more. The quaternary ammonium groups provide the number of positive charges of the polymer.

In the preferred aspects of the present invention, the ionic copolymer is employed as a dilute acidic solution of about 0.01% to about 1% by weight, and preferably about 0.05% to about 0.5% by weight of the copolymer. The acid contained in the solution is preferably $H_2SO_4$, and the pH value of the solution is between 0 and about 3. The use of a low pH value is preferred to obtain a relatively low viscosity of the copolymer solution to facilitate application of the polymer. The treatment with the ionic copolymer is generally about 1 minute to about 10 minutes, and preferably about 1 minute to about 2 minutes, and takes place at about room temperature.

The multifunctional copolymer, having a very good adhesion to the substrate surface, provides the surface with a charge opposite from that associated with the seed particles to be subsequently applied to the substrate. This difference in polarity provides for electrostatic attraction of the seed particles. After the substrate is brought into contact with the ionic copolymer composition, the substrate is rinsed to remove any access polymer not adhering to the substrate surface.

Next, the substrate and holes are contacted with a composition containing a catalytic composition capable of initiating the electroless plating process. The compositions contain a metal which can directly provide the catalytic sites, or serve as a precursor which leads to the catalytic sites. The metal present may be in the elemental form, an alloy, or compound, or mixtures thereof. The preferred metal catalysts are precious metals, such as gold, palladium, and platinum. In addition, in view of the improved conditioning of the substrate achieved by employing the multifunctional polymer, the catalyst can be a non-precious metal, such as copper, nickel, cobalt, iron, zinc, manganese, and aluminum.

The most preferred catalyst is palladium. A typical palladium composition contains about 1.2 to about 2.5 grams per liter of a palladium salt, which is preferably $PdCl_2$, about 80 to about 150 grams per liter of a stannous salt, which is preferably $SnCl_2 2H_2O$, and about 100 to about 150 milliliters per liter of an acid which is preferably HCl. When HCl is provided in the form of a 37% HCl solution, about 280 to about 360 milliliters of the HCl solution is preferably employed. The most preferred compositions contains about 1.5 grams per liter of $PdCl_2$ and about 280 milliliters per liter of 37% HCl. The composition is usually maintained at a temperature of about 65°±10° F.

A typical triple-seeder process is disclosed, for instance, in Alpaugh, et al., U.S. Pat. No. 4,525,390, disclosure of which is incorporated herein by reference.

Subsequently, the substrate is treated with an acid, an alkaline accelerator, such as a 2% NaOH solution to remove excess tin, which is typically deposited along with the Pd catalyst. This step usually takes about 1 to about 5, and more typically, about 1 to about 2 minutes.

The substrates can then be dried, such as being vacuum dried in an oven for 30 minutes at a temperature of about 100° C. In the drying operation, all the water is driven off irreversibly from the colloidal particles, leaving a shell of oxygen in the form of insoluble tin oxide.

After seeding, the substrates are then plated with a relatively thin layer of a conductive metal, such as nickel, or preferably copper.

This plating can be referred to as a flash plating, and is typically about 0.025 to about 0.10 mils. The plating is typically carried out employing a copper electroless flash bath. This first electroless plating bath employed typically contains up to about 2.3 ppm, and preferably about 0.2 to about 2.3 ppm and most preferably, about 0.5 to about 2 ppm of cyanide ions.

The first electroless plating bath employed has an oxygen content of not lower than 1 ppm below saturation, and preferably not lower than 0.5 ppm below saturation. In the most preferred aspects of the present invention, the oxygen content of the first electroless plating bath is at or about at the saturation level achievable using air. These values of the oxygen content are for the bath when at a room temperature of about 70° C. to 80° C.

The first copper electroless plating bath employed is generally an aqueous composition, which contains a source of cupric ion, a complexing agent for the cupric ion, and a pH adjustor, in addition to the cyanide ion source and oxygen. In addition, the plating bath also preferably includes a surface-active agent.

The cupric ion source generally used is a cupric sulfate or a cupric salt of the complexing agent to be employed.

The cupric ion source is employed in amounts of about 7 to about 12 grams per liter and preferably, about 8.0 to about 10.0 grams per liter and most preferably, about 8.5 to about 9.5 grams per liter, calculated as $CuSO_4$-$5H_2O$. In other words, when the cupric ion source is $CuSO_4$-$5H_2O$, then the amount is about 7 to about 12 grams per liter, and when the source is a different material, the amount employed will be such that the same amount of cupric ion will be present in the bath as when $CuSO_4$-$5H_2O$ is used.

Examples of some cyanides which can be employed according to the present invention are the alkali metal, alkaline earth metal, and ammonium cyanides, with sodium cyanide being preferred.

The most common reducing agent employed is formaldehyde. Examples of some other reducing agents include formaldehyde precursors or formaldehyde homopolymers, such as paraformaldehyde, trioxane, and gloxal; borohydrides such as alkali metal borohydrides (sodium and potassium borohydrides) and substituted borohydrides such as sodium trimethoxy borohydride; boranes such as amine borane (isopropyl amine borane and morpholine borane); and hypophosphite reducing agents.

The reducing agent is generally present in amounts from about 1 to about 6 milliliters per liter, preferably about 2 to about 4 milliliters per liter, and more preferably from about 2 to about 2.5 milliliters per liter.

Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono (gamma)-lactone, modified ethylene diamine acetates, such as N-hydroxy ethyl ethylene diamine triacetate. In addition, a number of other suitable cupric complexing agents are suggested in U.S. Pat. Nos. 2,996,408; 3,075,856; 3,076,855; and 2,938,805. The preferred complexing agents are ethylene diamine tetraacetic acid and the alkali metal salts thereof.

The amount of complexing agent employed in the first plating bath is about 30 to about 50 grams per liter.

The plating bath can also include a surfactant which assists in wetting the surface to be coated. A satisfactory surfactant is, for instance, an organic phosphate ester, available under the trade designation "Gafac RE-610." Generally, the surfactant is present in amounts from about 0.02 to about 0.3 grams per liter.

In addition, the pH of the bath is generally controlled, for instance, by the addition of a basic compound, such as sodium hydroxide or potassium hydroxide, in the desired amount to achieve the desired pH. The preferred pH of the first electroless plating bath is between 11.5 and 12.0, and most preferably between 11.6 and 11.8.

In addition, the plating bath can include other minor additives, as is known in the art.

The preferred plating baths employed have a specific gravity within the range of 1.06 to 1.08. Moreover, the temperature of the bath is preferably maintained between about 70° C. and 80° C., more preferably between about 70° C. and 75° C., and most preferably about 72° C. to about 74° C.

The plating with the initial electroless plating bath is generally carried out for about 15 minutes to up to about 2 hours and preferably about ½ to 1½ hours.

A photoresist can then be applied to the substrate. The resist, which can be employed according to the present invention, include both positive and negative resists.

Examples of some photoresists employed, according to the present invention, include negative or photohardenable polymerizable compositions of the type suggested in U.S. Pat. Nos. 3,469,982; 3,526,504; 3,867,153; and 3,448,098, and published European Patent Application 0049504, disclosures of which are incorporated herein by reference. Polymers from methylmethacrylate and from glycidyl acrylate and/or from a polyacrylate, such as trimethylol propane triacylate and pentaerythritol triacrylate, are commercially available from E. I. Du Pont de Nemours and Company under the trade designation "Riston."

Examples of some negative photoresists employed, according to the present invention, are from polymethylmethacrylates such as those commercially available from E. I. du Pont de Nemours and Company, under the trade designations "Riston 3120," "Riston T-168" and "Riston 3515." T-168 is a negative photoresist material from polymethylmethacrylate and crosslinkable monomeric units, such as from trimethylol propane triacrylate. A detailed discussion of preparing a negative resist from polymethylmethacrylate, trimethylol propane triacrylate and trimethylene glycol diacetate can be found in Example 1 of U.S. Pat. No. 3,867,153. Riston 3120 is an acrylate-based negative photoresist material containing carboxylic groups and is developable in an aqueous medium.

Examples of aqueous developable negative photoresists are described in published European Patent Application 0049504, such as Example 23 thereof, disclosure of which is incorporated herein by reference. A typical resist described therein is from a copolymer of methylmethacrylate, ethyl acrylate, and acrylic acid, and a copolymer of styrene and maleic anhydride isobutyl ester.

An example of another type of photoresist is based on phenol formaldehyde novalak polymers. A particular example of such is Shipley AZ1350, which is an m-cresol formaldehyde novalak polymer composition. Such is a positive resist composition and includes therein, diazoketone, such as 2-diazo-1-naphthol-5-sulphonic acid ester. In such a composition, the orthodiazoketone, during the photochemical reaction, is converted to a carboxylic acid. This, in turn, converts a neutral-organic soluble molecule (the phenolic polymer) to one that is readily soluble in weakly alkali aqueous developer solvents. The composition usually contains about 15% or so, by weight, of the diazoketone compound.

The photoresist is typically applied to a thickness of about 0.6 mils to about 3.0 mils.

The layer of resist material is then selectively exposed to the desired pattern and imaged by a known technique, such as ultraviolet light, electron beam, or X-ray beam technique, followed by removal of the exposed portions in the case of positive resist materials, by etching or dissolution in an appropriate liquid. In the case of negative resist materials, the unexposed portions are removed.

The resist is developed to provide the desired circuit pattern.

The substrate can then be plated up to the desired line thickness, by plating from a second electroless plating bath. The parameters of the electroless copper plating bath, during the plate up cycle, are important in achieving the most preferred results obtainable by the present invention. For instance, an overactive plating bath can result in the deposit of extraneous copper onto the non-functional areas of the circuit panel. It has been found that the EMIX potential of the bath is preferably maintained at a value which is less negative than −650 MV—vs—Calomel electrode. It is likewise preferred that the formaldehyde concentration be maintained at a concentration less than 20 ml/l, higher concentrations tend to result in an unstable plating bath and unacceptable copper ductility.

This second electroless plating bath contains about 5 to about 11 ppm, and preferably about 5 to about 8 ppm of cyanide ions.

The second electroless plating bath employed has an oxygen content of not lower than 1.5 ppm below saturation, preferably an oxygen content of not lower than 1.0 ppm below saturation, and more preferably not lower than 0.5 ppm below saturation. In the most preferred aspects, the oxygen content of the second electroless plating bath is at or about saturation.

The values of the oxygen content are for the bath when at a temperature of about 70° C. to about 80° C.

The oxygen saturation level of the baths in accordance with the present invention at temperatures of about 70° C. to 80° C. is typically about 3.5.

The above amounts of oxygen are those measured at the bath temperature by employing a Leeds & Northrup dissolved oxygen meter and probe as calibrated to air saturation in deionized water at the bath temperature.

The level of the oxygen is maintained by introducing into the plating tank a mixture of oxygen and inert gas, preferably by adding air. Mixed with the air or oxygen can be an inert gas such as hydrogen, nitrogen, argon, neon, and krypton. At a plating temperature of about 73° C.±0.5° C., about 1.0 to 3.0 SCFM (standard cubic feed per minute) per thousand gallons of bath of air are employed.

When used, the inert gas is preferably premixed with the oxygen or air prior to the introduction into the bath. However, the individual gases can be introduced into the bath separately, if desired.

The cupric ion source in the second electroless plating bath is employed in amounts of about 9 to about 14, and preferably about 10 to about 12 grams per liter, calculated as $CuSO_4.5H_2O$.

The reducing agent is present in amounts of about 1 to about 4 milliliters per liter, and preferably about 2 to about 2.5 milliliters per liter. The preferred reducing agent is formaldehyde, and is preferably employed as a 37% solution. The above amounts of formaldehyde are the values obtained by the sodium sulfite method by titration to a pH of 9.00, as generally discussed by Walker, Formaldehyde, Third Edition, 1975, pages 486–488, Robert E. Krieger Publishing Company, Huntington, N.Y.

The amount of complexing agent employed in the second electroless plating bath is about 25 to about 50 grams per liter, and preferably about 30 to about 40 grams per liter.

The amount of surfactant, if present, is usually about 0.01 to about 0.3 grams per liter.

In addition, the preferred pH of the second electroless plating bath is between 11.6 and 12.0, and most preferably between 11.7 and 11.9. In addition, the second electroless plating bath has a specific gravity within the range of 1.060 to 1.080. Moreover, the temperature of the second electroless plating bath is preferably maintained between about 70° C. and 80° C., and more preferably between about 70° C. and 76° C., and most preferably about 72° C. to about 75° C.

The plating from the second electroless plating bath is generally from about 8 to about 20 hours, or until the desired thickness of copper film is achieved, which is typically about 0.7 mils to about 1.8 mils.

The remaining photoresist is removed by dissolution in a suitable solvent. In the case of Riston 3120, the resist is stripped by employing sodium hydroxide. The thin metal layer is then etched. In the case of copper, the etching can be carried out employing any of the etchants disclosed hereinabove.

According to a further aspect of the present invention, the deposited metal layer is subjected to temperatures of at least about 100° C. for a time sufficient to enhance the adhesion of the metal layer to the substrate. Typically, the heat treatment time at 100° C. and above is at least about 15 minutes, and up to a maximum of 2 hours. The temperature of the treatment should be less than that which would distort the circuit pattern, and the maximum temperature typically is about 160° C.

FIG. 1 illustrates the increased adhesion achieved by the heating, pursuant to the present invention. In particular, a 22% increase of adhesion on an FR-4 epoxy substrate was achieved by heating at 110° C. for at least 15 minutes. The substrate had previously been treated by employing a 1 oz. sacrificial copper foil also pursuant to the aspect of the present invention. The copper lines treated were about 4.08 mils wide, and about 1.4 mils thick.

The testing procedure for adhesion was the same as the one used for the polytetrafluoroethylene (PTFE) example discussed hereinbelow except, of course, the dielectric substrate is the FR-4 epoxy in place of the PTFE.

To test the improved in adhesion due to the morphology of the copper foil employed, a polytetra-fluoroethylene (PTFE) substrate was employed.

Polytetrafluoroethylene based materials were chosen because they are among the worst possible substrate for adhesion thereto. PTFE composite layers (0.0051 mm thick) were laminated between two sheets of copper with thickness of 0.25 to 0.036 mm, respectively, under a pressure of 11.7 MN/sq. m and a temperature of 388° C. using a Tetrahedron MTP-14 press. A strip of polyimide film was used as a separator sheet between the fluoropolymer composite, and the 0.036 mm copper foil to initiate mechanical peel. The range for laminate bond strength was 160–180 g/mm. The copper sheets and the required morphology were obtained from Gould Electronics; Foil Division.

What is claimed is:

1. Process for depositing a conductive metal onto the surface of a dielectric substrate selected from the group consisting of thermosetting polymeric materials and thermoplastic polymeric materials which comprises:

(a) obtaining a metal sheet having a roughened surface that has the following parameters:
$R_a$=0.05–0.08 mil,
$R_{max}$=0.20–0.55 mil,
$S_m$=1.00–3.00 mil,
$R_p$=0.20–0.35 mil, and
surface area=0.90–1.20 square mils wherein $R_a$ is the average roughness and the arithmetic mean of the departures from horizontal mean line profile;

$R_{max}$ is the maximum peak-to-valley height;

$S_m$ is the mean spacing between high spots at the mean line;

$R_p$ is the maximum profile height from the mean line; and surface area is the area under the surface profile from each measurement using a Talysurf S-120 profilometer;

(b) laminating said metal sheet to tile dielectric substrate surface by pressing the roughened surface of the metal sheet against the surface of the substrate;

(c) removing the metal from the substrate;

(d) then seeding said substrate surface to render it active for electroless plating thereon; and (e) plating a metal thereon from an electroless plating bath.

2. The process of claim 1 wherein said metal sheet is copper.

3. The process of claim 1 wherein said metal sheet is removed by etching.

4. The process of claim 3 wherein said seeding includes containing with a seed composition containing palladium and tin.

5. The process of claim 4 wherein prior to contacting with the seeder composition, the substrate is contacted with a composition containing a multifunctional ionic polymer material containing at least two available ionic moieties, wherein said ionic moieties are of a charge opposite from the charge associated with the seeder particles to be subsequently applied to the substrate.

6. The process of claim 5 wherein said multifunctional ionic polymer material is a multifunctional cationic material.

7. The process of claim 5 wherein said multifunctional ionic polymer material is a copolymer of acrylamide and ammonium quaternary compounds.

8. The process of claim 5 wherein said multifunctional ionic polymer material is a copolymer of acrylamide and betamethacryloxyethyltrimethyl ammonium methyl sulfate.

9. The process of claim 1 wherein said dielectric substrate includes an epoxy resin.

10. The process of claim 1 wherein said electroless plating bath is a copper bath.

11. The process of claim 1 wherein said plating is selective plating defined by a photoresist.

12. The process of claim 1 wherein the metal plated on the substrate is subjected to temperature of at least about 100° C. for a time sufficient to increase the adhesion of the metal to the substrate.

13. The process of claim 12 wherein said time is at least about 15 minutes.

14. The process of claim 13 wherein said electroless plating bath is a copper bath.

15. The process of claim 12 wherein said plating is selective plating defined by a photoresist.

16. The process of claim 12 wherein said seeding includes contacting with a seed composition containing palladium and tin.

17. The process of claim 1 which further comprises prior to contacting with the seeder composition, contacting the substrate with a composition containing a multifunctional ionic polymer material containing at least two available ionic moieties, wherein said ionic moieties are of a charge opposite from the charge associated with the seeder particles to be subsequently applied to the substrate.

18. The process of claim 17 wherein said multifunctional ionic polymer material is a multifunctional cationic material.

19. The process of claim 17 wherein said multifunctional ionic polymer material is a copolymer of acrylamide and ammonium quaternary compounds.

20. The process of claim 1 wherein said multifunctional ionic polymer material is a copolymer of acrylamide and betamethacryloxyethyltrimethyl ammonium methyl sulfate.

21. The process of claim 1 wherein said dielectric substrate includes an epoxy resin.

22. The process of claim 1 wherein said temperature is about 100° C. to about 160° C. and said time is about 15 minutes to about 2 hours.

* * * * *